(12) United States Patent
Varjo et al.

(10) Patent No.: US 6,504,369 B1
(45) Date of Patent: Jan. 7, 2003

(54) DECOUPLING TWO OR MORE CHANNELS ON RF COIL SYSTEMS

(75) Inventors: Tomi E. K. Varjo, Espoo (FI); Kim I. Fallström, Espoo (FI); Markku K. J. Seppänen, Helsinki (FI)

(73) Assignee: Koninklijke Philips Electronics, N.V., Eindhoven (NL)

( * ) Notice: Subject to any disclaimer, the term of this patent is extended or adjusted under 35 U.S.C. 154(b) by 36 days.

(21) Appl. No.: 09/655,254

(22) Filed: Sep. 5, 2000

(51) Int. Cl.$^7$ ................................................. G01V 3/00
(52) U.S. Cl. ...................................... 324/318; 324/322
(58) Field of Search ............................... 324/318, 322, 324/309, 319, 320, 307, 321, 300, 311; 600/422

(56) References Cited

U.S. PATENT DOCUMENTS

| | | | | |
|---|---|---|---|---|
| 5,351,688 A | * | 10/1994 | Jones | 600/422 |
| 5,370,118 A | * | 12/1994 | Vij et al. | 600/422 |
| 5,500,596 A | | 3/1996 | Grist et al. | 324/318 |
| 5,602,479 A | * | 2/1997 | Srinivasan et al. | 324/318 |
| 5,804,969 A | | 9/1998 | Lian et al. | 324/318 |
| 5,898,306 A | * | 4/1999 | Liu et al. | 324/322 |
| 6,414,488 B1 | * | 7/2002 | Chmielewski | 324/311 |

OTHER PUBLICATIONS

Japanese Article "A highly Sensitive Wrap Around Type RF coil for MRI: Application of Inductive Decoupler for Multiple RF coil". Tetsuhiko Takahashi et al., from Transactions of the Institute of Electronics, Information and Communication Engineers D–II vo.*

* cited by examiner

Primary Examiner—Edward Lefkowitz
Assistant Examiner—Tiffany A. Fetzner
(74) Attorney, Agent, or Firm—Fay, Sharpe, Fagan, Minnich & McKee, LLP

(57) ABSTRACT

A radio frequency receiving coil (50) is disposed in an examination region (10) of a magnetic resonance imaging apparatus. The radio frequency coil assembly includes a first loop coil (70) and a second loop coil (72) disposed parallel and coaxially to each other. The loop coils are disposed parallel to a main magnetic field ($B_o$) of the magnetic resonance imaging apparatus with the common axis perpendicular to the main magnetic field. The first and second loop coils are interconnected with a decoupling assembly (74). The inductive decoupling assembly includes a pair of loop coils (80, 82) which are inductively coupled to each other with an inductive coupling which is equal and opposite to the inherent inductive coupling between the first and second loop coils. The decoupling coils are interconnected with the first and second loop coils such that the net inductive coupling is nulled. In a quadrature embodiment, a second pair of loop coils (90, 92) is disposed perpendicular to the first pair of loop coils. Decoupling coils for the second pair of loop coils are disposed parallel to the decoupling coils for the first pair of loop coils.

20 Claims, 3 Drawing Sheets

DECOUPLING TWO OR MORE CHANNELS ON RF COIL SYSTEMS

BACKGROUND OF THE INVENTION

The present invention relates to the diagnostic imaging arts. It finds particular application in conjunction with imaging head and neck regions with an open MRI scanner and will be described with particular reference thereto. It will be appreciated, however, that the present invention is also applicable to spectroscopy and diagnostic imaging of other regions of the patient and is not limited to the aforementioned applications.

In magnetic resonance imaging, a uniform main magnetic field is created through an examination region in which a subject to be examined is disposed. With open magnetic resonance systems, the main magnetic field is vertical, perpendicular to the subject. A series of radio frequency (RF) pulses and magnetic field gradients are applied to the examination region to excite and manipulate magnetic resonances. Gradient magnetic fields are conventionally applied to encode spatial position and other information in the excited resonance.

Typically, the transmitted RF signals are orders of magnitude larger than the magnetic resonance signals generated by the excited nuclei and detected by the RF receiver coils. To receive the weak resonance signals, localized coils, such as head coils, are often used. Loop or solenoid coils are among the most sensitive coils. However, when two or more are used, they couple strongly which degrades their sensitivity.

With existing structures, it has been difficult to build volume coils consisting of two or more coaxial solenoid coils because of the strong coupling between solenoid coils. When each solenoid element is tuned to resonance frequency, the coupling between the coils detunes the coils causing a separation of the frequencies. Use of additional decoupling circuits typically decreases the SNR of th e coil elements so much that they are unacceptable to be us ed as RF-coils of MRI systems.

U.S. Pat. No. 5,500,596 to Grist and Alley arranges two solenoid coils in such a way that they are sensitive to some of the same imaging area with overlapping loops in the middle of the structure. The overlapping coils are planar coils t hat do not have as high a signal-to-noise ratio as the volume types of coils. The mutual coupling of the top and bottom coils is reduced by positioning the is coils far from each other compared to the coil dimensions.

This further lowers the signal-to-noise ratio of the system.

U.S. Pat. No. 5,804,969 to Lian and Roemer decouples the resonating coils by adding resonant rings. The resonant rings couple to the imaging volume which reduces the Q-values of the main coils. This manifests in lower signal-to-noise characteristics.

The present invention provides a new and improved method and apparatus that overcomes the above referenced problems and others.

SUMMARY OF THE INVENTION

In accordance with one aspect of the present invention, a diagnostic medical imaging system is provided. A localized RF coil assembly containing four solenoid coils receives resonance signals from excited dipoles in the imaging region. The coils are arranged such that the first and second coils have a common axis perpendicular to an axis common to the third and fourth coils. The coil assembly receives RF resonance signals in quadrature, which are received by one or more receivers.

The coil axis defines the direction of the RF magnetic field for which the coil loop has optimum RF sensitivity within a volume surrounded by the coil loop. A video processor withdraws selected portions of the image representation and converts them into appropriate form for human-readable display.

In accordance with another aspect of the present invention, a method of positioning is provided. Four solenoid coils are arranged in two coil pairs such that the first and second coils, which comprise the first coil pair, have an inherent coupling with each other, and the third and fourth coils, which comprise the second coil pair, have an inherent coupling with each other. In addition, the solenoid coils of the first coil pair have an inherent coupling between the solenoid coils of the second coil pair. Four coil loops, each one connected to a different solenoid coil are positioned adjacent the solenoid coils such that they cancel the inherent coupling between the solenoid coils in the first and second coil pairs and between the first and second coil pair.

One advantage of the present invention resides in an RF-coil structure having a large imaging area.

Another advantage of the present invention is that it allows for coil geometries with mutual inductive coupling.

Another advantage of the present invention is that it allows for a multi-loop RF-coil system.

Another advantage of the present invention is that it provides better image uniformity.

Yet another advantage resides in a higher signal-to-noise ratio.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
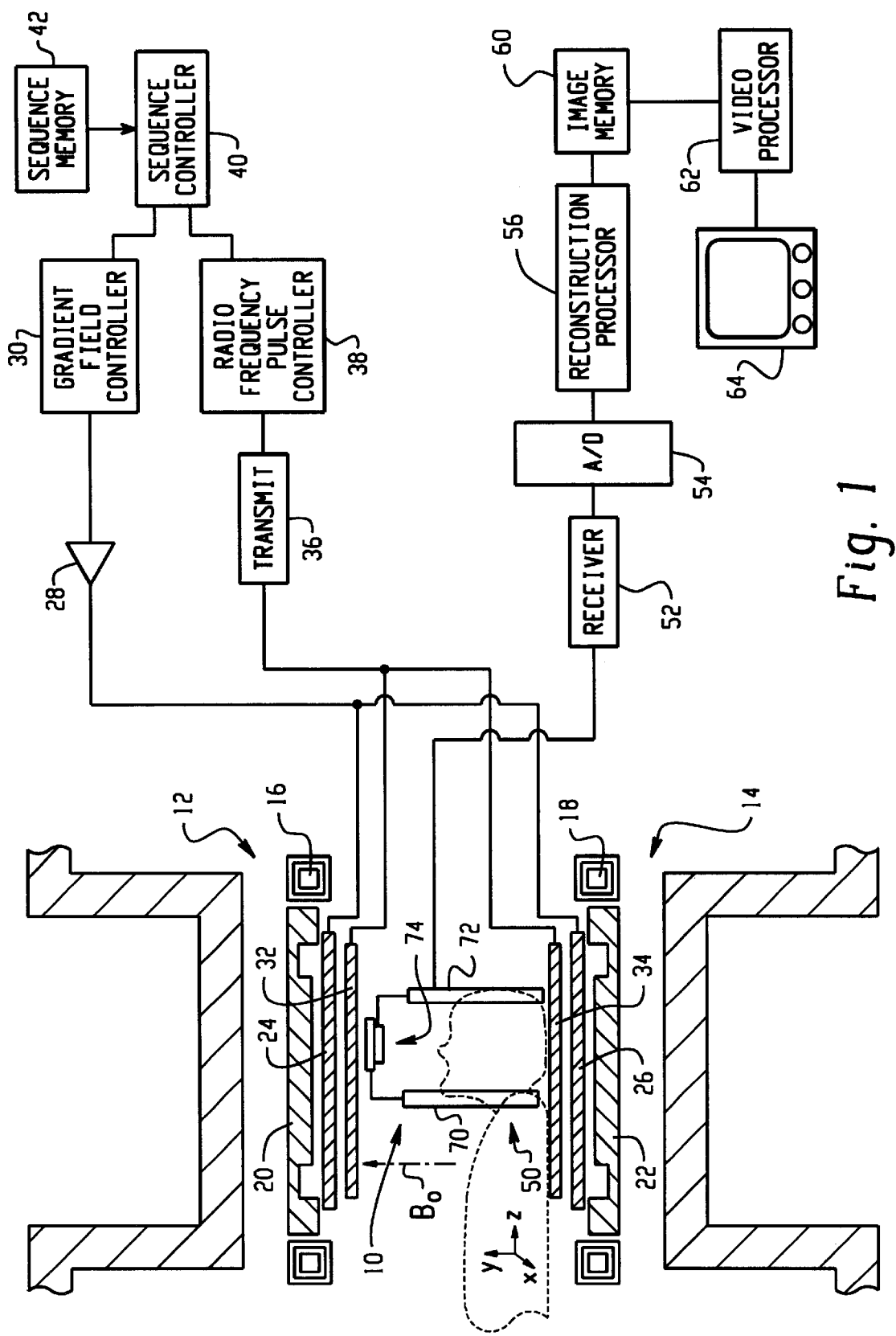
FIG. 1 is a diagrammatic illustration of a magnetic resonance imaging system in accordance with the present invention.

With reference to FIG. 1, in an open MRI system, an imaging region 10 is defined between an upper pole assembly 12 and a lower pole assembly 14. A pair of annular super-conducting magnets 16, 18 surround upper and lower pole pieces 20, 22 generating a temporally constant, main magnetic field $B_o$ through the imaging region 10. It is to be appreciated that the open MRI apparatus may have a variety of pole pieces or, in some instances, no pole pieces at all. Optionally, a ferrous flux return path is provided between the pole assemblies remote from the imaging region 10.

For imaging, magnetic field gradient coils 24, 26 are disposed on opposite sides of the imaging region 10 adjacent the pole pieces 20, 22. In the preferred embodiment, the gradient coils are planar coil constructions which are connected by gradient amplifiers 28 to a gradient magnetic field controller 30. The gradient magnetic field controller 30 causes current pulses which are applied to the gradient coils such that gradient magnetic fields are superimposed on the temporally constant and uniform field $B_o$ across the imaging region 10. The gradient fields are typically generated along a longitudinal or y-axis, a vertical or z-axis and a transverse or x-axis.

In order to excite magnetic resonance in selected dipoles of a subject disposed in the imaging region 10, radio frequency coils 32, 34 are disposed between the gradient coils 24, 26 and the imaging region 10. At least one radio frequency transmitter 36, preferably a digital transmitter, causes the radio frequency coils to transmit radio frequency pulses requested by a radio frequency pulse controller 38 to be transmitted into the imaging region 10. A sequence controller 40, under operator control, retrieves an imaging sequence from a sequence memory 42. The sequence controller 40 provides the selected sequence information to the gradient controller 30 and the radio frequency pulse controller 38 such that radio frequency and gradient magnetic field pulses in accordance with the selected sequence are generated.

Typically, the radio frequency coils 32, 34 are general purpose coils and are operable in both transmit and receive modes. For better receive sensitivity, a localized coil 50 is disposed closely adjacent a region of the subject to be imaged. Optionally, the localized coil 50 can be used in both a transmit mode and a receive mode.

Magnetic resonance signals picked up by the localized coil 50 are demodulated by one or more receivers 52, preferably digital receivers. Signals from analog receivers are digitized with an analog-to-digital converter 54. The digitized signals are processed by a reconstruction processor 56 into volumetric or other image representations which are stored in a volumetric image memory 60. A video processor 62, under operator control, withdraws selected image data from the volume memory and formats it into appropriate data for display on a human readable display 64, such as a video monitor, active matrix monitor, liquid crystal display, or the like.

Figure 2:
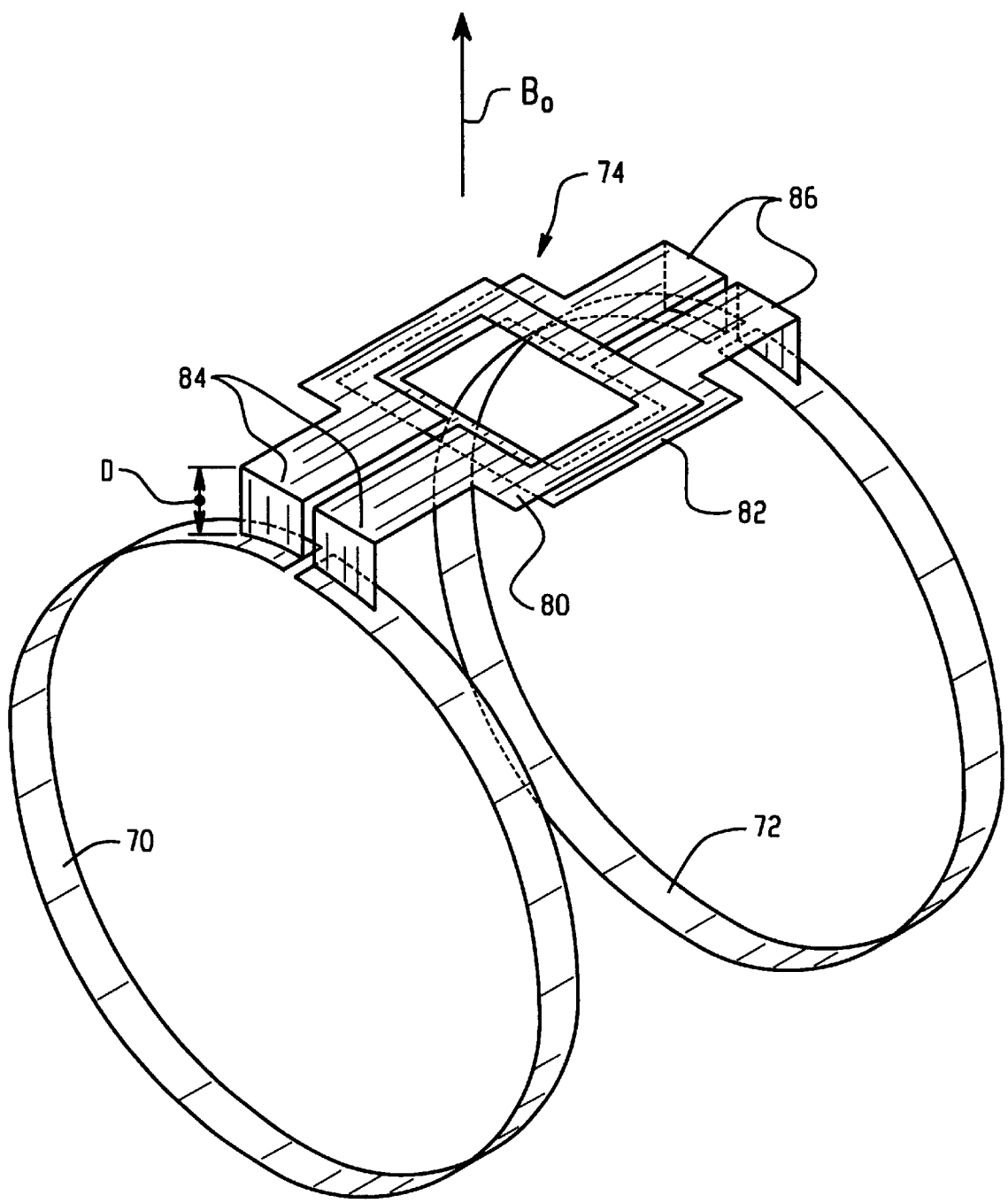
FIG. 2 is a perspective view of an RF coil assembly containing two loop coils in accordance with the present invention.

With reference to FIG. 2, the localized coil 50 has two coaxial loop or solenoid coils 70, 72, made preferably of foil strips and are separated from each other by a distance comparable to or less than the diameter of the coils. In the illustrated head coil, the loops 70, 72 have vertical and horizontal diameters and shapes that are sized to receive a patient's head. The axes of the coils are both oriented perpendicular to the z-axis and the coils have an optimum sensitivity to the y component of the resonance signal within the imaging volume. The coils 70, 72 contain tuning means (not shown) to resonate the coils at a desired operating frequency and a means to connect the coils to preamplifiers (not shown.) The two loop coils inherently inductively couple, which degrades performance. A decoupling coil assembly 74 creates a controlled inductive coupling which is equal and opposite to the inherent coupling. The inductive coupling assembly 74 includes a first coil loop 80 connected with the first RF loop coil 70 and a second loop coil 82 connected with the second RF coil 72. The decoupling loop coils are positioned relative to each other such that they couple inductively in an amount which offsets the inherent coupling of the RF coils 70, 72 at the resonance frequency. The decoupling coil loops 80, 82 are disposed such that their axes are perpendicular to the axes of the RF loop coils 70, 72 and furthermore such that the axes of the decoupling coils are parallel to the $B_o$ field. With this positioning, the decoupling coils have a minimum effect to image uniformity by being maximally unsensitive to the RF-field generated by the excited nuclei in the imaging volume. A distance D between the decoupling coils 80, 82 and the coaxial RF coils 70, 72 is sufficiently large that the decoupling coil system is not loaded by the patient. The exact shapes of the RF coils 70, 72 and the decoupling coils 80, 82 are not specifically restricted to be circular, rectangular, or planar, but may vary according to limitations set by anatomy, mechanical design of the coil body, manufacturing techniques or the like.

The RF coils 70, 72 are connected to the decoupling coils 80, 82, respectively, by wide foil strips or thick cables 84, 86 such that the connection part causes a minimum decrease of the Q-value and a minimum increase of the inductance of the RF coils 70, 72.

With this structure, the magnetic flux caused by the first RF coil through the second RF coil of the coaxial RF coil pair 70, 72 is canceled by the decoupling coils 80, 82. The decoupling coils 80, 82 enable the main RF coils 70, 72 to be tuned to the selected resonance frequency without the help of additional tuning circuits.

Figure 3:
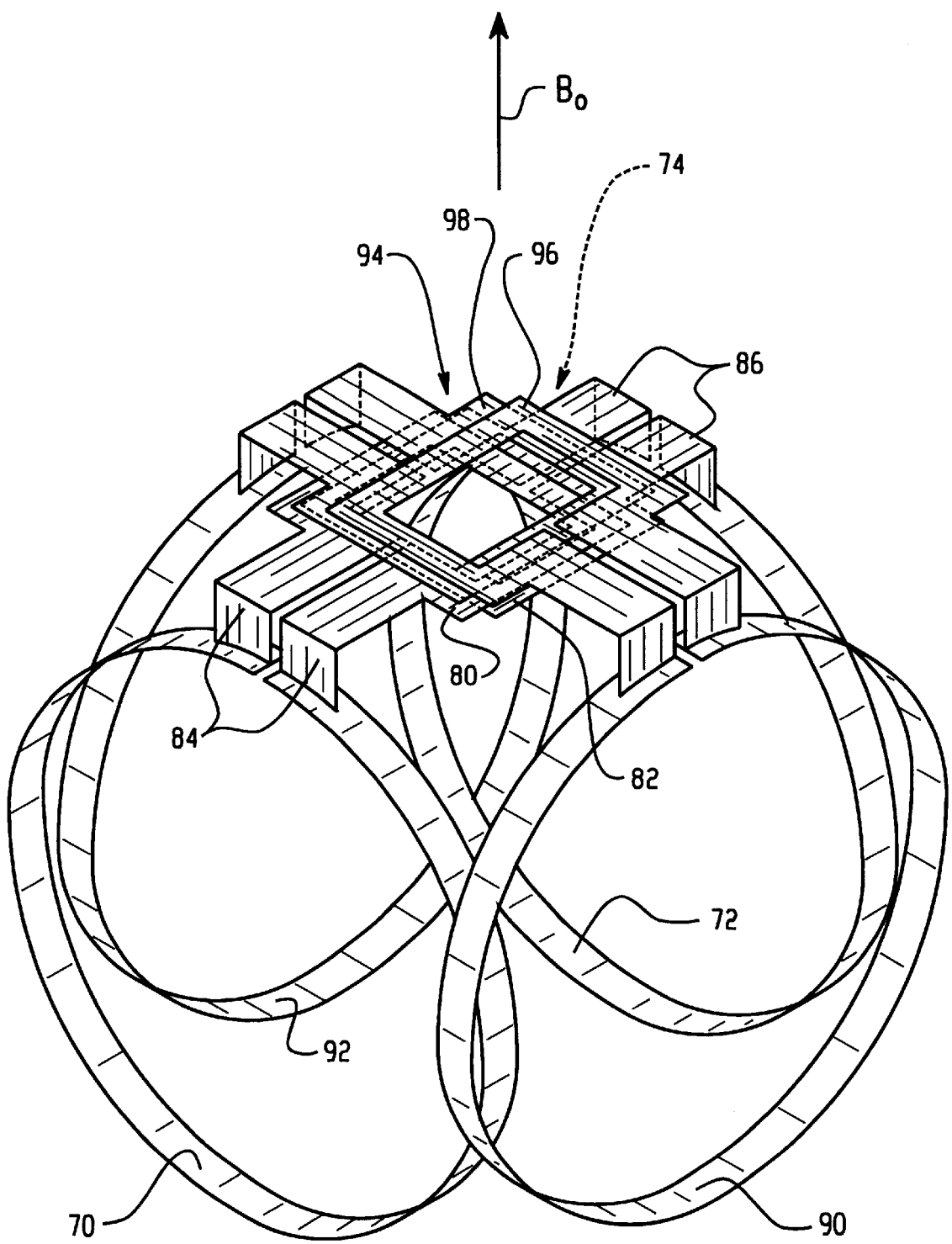
FIG. 3 is a perspective view of a quadrature RF coil assembly in accordance with the present invention.

With reference to FIG. 3, in an alternate quadrature embodiment, a second RF coil pair 90, 92 is positioned perpendicular to the first RF coil pair 70, 72. This construction can be used as a four-channel phased-array volume coil. The second RF coil pair 90, 92 is rotated with respect to the first RF coil pair 70, 72 such that the direction of sensitivity of each pair are orthogonal to each other for quadrature reception. A second decoupling assembly 94 includes a pair of decoupling coils 96, 98 positioned above the RF coils 90, 92 as described previously. The decoupling coils 96, 98 overlap each other and are separated by insulators.

The four decoupling coils 80, 82, 96, 98 cancel the coupling between the first coaxial RF coil pair 70, 72 and between the second RF coil pair 90, 92. In addition, the four decoupling coils can cancel any coupling between the first and second RF coil pairs, particularly where the solenoid coils are not coaxial or not orthogonal to each other.

In another alternate embodiment, three loop coils are disposed along a common axis. A decoupling coil assembly is interconnected between each coupling pair.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus comprising:
   a magnet assembly which generates a temporally constant main magnetic field through an examination region;
   an RF reception coil assembly which receives resonance signals from resonating dipoles in the examination region, the RF coil assembly including:
   a first pair of RF receive coils which inherently inductively couple to each other during a receive mode of operation disposed in the examination region,
   a decoupling means connected with the pair of RF receive coils for counteracting in the receive mode the inherent, inductive coupling between the pair of RF receive coils while both coils of the first pair are concurrently receiving the resonance signals;

at least one radio frequency receiver for demodulating the resonance signals from the RF reception coil assembly; and, a processor for processing the demodulated resonance signals.

2. The magnetic resonance apparatus set forth in claim 1 wherein the pair of RF coils includes:

a first and a second RF coil disposed to optimize RF sensitivity to RF field components in a direction perpendicular to the main magnetic field and with a non-zero inherent inductive coupling between the first and the second RF coil.

3. The magnetic resonance apparatus set forth in claim 1 further including:

a second RF receive coil pair which is disposed for optimum RF sensitivity to RF field components in a direction perpendicular to the main magnetic field and orthogonal to a direction of RF sensitivity of the first RF receive coil pair; and, a second decoupling means connected with the second RF receive coil pair for counteracting during the receive mode inherent inductive coupling both (i) between the coils of the second RF receive coil pair and (ii) between the coils of the first and second RF receive coil pairs.

4. The magnetic resonance apparatus set forth in claim 1 further including:

a third RF receive coil which receives resonance signals from resonating dipoles in the examination region, and with a non-zero inherent inductive coupling during the receive mode between the third RF receive coil and the pair of RF receive coils;

positioning the third RF receive coil such that it is disposed for optimum RF sensitivity to RF field components in a direction perpendicular to the main magnetic field; and, a third decoupling means connected with the third RF receive coil for counteracting during the receive mode the coupling between the third RF receive coil and the pair of RF receive coils.

5. The magnetic resonance apparatus as set forth in claim 4 wherein the third decoupling means includes:

a third decoupling coil disposed for optimum RF sensitivity to RF field components in a direction parallel to the main magnetic field and parallel to coils the decoupling means connected with the pair of RF receive coils.

6. The magnetic resonance apparatus set forth in claim 5 wherein the third RF receive coil is connected to the third decoupling coil by one of a wide foil and thick cable to form a separate continuous current loop comprised of the third RF receive coil and the third decoupling coil.

7. The magnetic resonance apparatus set forth in claim 5, further including:

a fourth RF coil positioned parallel to the third RF coil to receive resonance signals from resonating dipoles in the examination region, the fourth RF coil having a non-zero inherent inductive coupling with the third and pair of RF coils; and, a fourth decoupling coil connected with the fourth RF coil and inductively coupled with the third and pair of decoupling coils to counteract the inherent coupling between the fourth RF coil with the third RF coil and the pair of RF coils.

8. A method of decoupling a plurality of coils while the coils are concurrently receiving magnetic resonance signals comprising:

disposing a pair of RF solenoid coils coaxial to each other, which solenoid coils inherently inductively couple to each other;

interconnecting a conductive coupling assembly between the pair of solenoid coils, which inductive coupling assembly offsets the inherent inductive coupling between the pair of solenoid coils;

positioning the pair of solenoid coils and the inductive coupling coils in a temporally constant main magnetic field;

exciting magnetic resonance in dipoles of interest between the pair of solenoid coils;

in receive mode, concurrently (i) decoupling the pair of solenoid coils with the conductive coupling assembly while both solenoid coils are receiving and (ii) receiving magnetic resonance signals with both solenoid coils of the pair;

demodulating the received magnetic resonance signals.

9. The magnetic resonance method as set forth in claim 8 wherein the coupling assembly includes a pair of inductively coupled loop coils and wherein the positioning step includes:

positioning the pair of solenoid coils such that their common axis is perpendicular to the temporally constant magnetic field and positioning the inductive coupling assembly such that the loop coils are disposed in a plane perpendicular to the main magnetic field.

10. An RF coil assembly for receiving magnetic resonance signals, the RF coil assembly comprising:

a pair of RF coils including a first solenoid coil and a second solenoid coil disposed adjacent the first solenoid coil such that the first and second solenoid coils have an inherent inductive coupling during a receive mode in which both coils are concurrently receiving magnetic resonance signals;

a decoupling coil assembly connected between the first and second solenoid coils, the decoupling coil assembly providing an inductive coupling between the first and second solenoid coils which in the receive mode cancels the inherent inductive coupling.

11. The RF coil assembly set forth in claim 10 wherein the pair of RF coils is arranged such that the first solenoid coil is disposed parallel to the second solenoid coil and such that the first and second solenoid coils share a common axis.

12. The RF coil assembly set forth in claim 11 wherein the first solenoid coil is a single loop coil disposed in a first plane whose normal is the common axis, and the second solenoid coil is a single loop coil disposed in a second plane whose normal is the common axis.

13. An RF coil assembly comprising:

a pair of parallel RF coils having a common axis, the pair including a first single loop coil disposed in a first plane whose normal is the common axis and a second single loop coil disposed in a second plane whose normal is the common axis and adjacent the first solenoid coil such that the first and second solenoid coils have an inherent inductive coupling to each other during a receive mode both RF coils of the pair are actively being used;

a decoupling coil assembly including a pair of coil loops disposed in parallel planes which are perpendicular to the first and second planes, the assembly being connected between the first and second solenoid coils, the decoupling coil assembly providing an inductive coupling between the first and second solenoid coils which cancels the inherent inductive coupling between the pair of RF coils during the receive mode.

14. The RF coil assembly set forth in claim 13 wherein the pair of coil loops disposed in parallel planes which are perpendicular to the first and second planes are separated from each other by an insulator.

15. The RF coil assembly set forth in claim 14 wherein the first solenoid coil is connected to the first coil loop by one of a wide foil and thick cable, and the second solenoid coil is connected to the second coil loop by one of a wide foil and thick cable to form two separate continuous current loops each comprised of one of the solenoid coils and one of the coil loops.

16. The RF coil assembly set forth in claim 13 further including:
   a second pair of RF coils including a third solenoid coil and a fourth solenoid coil disposed adjacent the third solenoid coil such that the third and fourth solenoid coils have an inherent inductive coupling to each other while active during the receive mode;
   a second decoupling coil assembly connected between the third and fourth solenoid coils, the second decoupling coil assembly providing an inductive coupling between the third and fourth solenoid coils during the receive mode which cancels the inherent inductive coupling;
   positioning the pair of solenoid coils such that the axes of the solenoid coils are perpendicular to the temporally constant magnetic field and generally parallel to each other and positioning the inductive coupling assembly such that the loop coils are disposed in a plane perpendicular to the main magnetic field.

17. The RF coil assembly set forth in claim 16 further including that the second coil assembly is rotated 90° with respect to the first coil assembly, to form a combined coil assembly.

18. A magnetic resonance apparatus comprising:
   a magnet assembly which generates a temporally constant main magnetic field through an examination region;
   a local RF coil assembly which receives resonance signals from resonating dipoles in the examination region, the local RF coil assembly including:
      a pair of RF coils disposed in the examination region for optimum sensitivity to RF field components in a direction perpendicular to the main magnetic field which RF coils inherently, inductively couple with each other during a receive mode,
      first and second decoupling coils disposed for optimum RF sensitivity to RF field components in a direction parallel to the main magnetic field, the first and second decoupling coils coupling with an inductive coupling that is equal and opposite to the inherent inductive coupling between the first pair of RF coils, the first and second decoupling coils being connected with the pair of RF coils to counteract the inherent coupling between the pair of RF coils at least during receive mode while both coils of the RF coil pair are receiving the resonance signals;
   at least one radio frequency receiver for demodulating the resonance signals from the RF coil assembly; and,
   a processor for processing the demodulated resonance signals.

19. The magnetic resonance apparatus set forth in claim 18 wherein the first RF coil is connected to the first decoupling coil by one of a wide foil and thick cable, and the second RF coil is connected to the second decoupling coil by one of a wide foil and thick cable to form two separate continuous current loops each comprised of one of the RF coils and one of the decoupling coils.

20. The magnetic resonance apparatus as set forth in claim 18 further including:
   a second pair of RF receive coils rotated 90° with respect to the first pair of RF receive coils to form a combined local coil assembly; and,
   a second pair of decoupling coils disposed such that they conform parallel to the first pair of decoupling coils.

* * * * *